United States Patent
Nomura

(10) Patent No.: US 8,674,776 B2
(45) Date of Patent: Mar. 18, 2014

(54) OSCILLATOR CIRCUIT, OSCILLATOR, ELECTRONIC APPARATUS, AND ACTIVATION METHOD OSCILLATOR CIRCUIT

(75) Inventor: Masataka Nomura, Minowa-Machi (JP)

(73) Assignee: Seiko Epson Corporation, Tokyo (JP)

( * ) Notice: Subject to any disclaimer, the term of this patent is extended or adjusted under 35 U.S.C. 154(b) by 41 days.

(21) Appl. No.: 13/605,557

(22) Filed: Sep. 6, 2012

(65) Prior Publication Data
US 2013/0076452 A1 Mar. 28, 2013

(30) Foreign Application Priority Data
Sep. 28, 2011 (JP) .................................. 2011-212838

(51) Int. Cl.
*H03B 5/06* (2006.01)
*H03B 5/32* (2006.01)

(52) U.S. Cl.
USPC ........................ 331/172; 331/158; 331/116 R

(58) Field of Classification Search
USPC ..................................... 331/172, 158, 116 R
See application file for complete search history.

(56) References Cited

U.S. PATENT DOCUMENTS

| | | | | |
|---|---|---|---|---|
| 4,987,388 A | * | 1/1991 | Prakash et al. | 331/158 |
| 6,239,664 B1 | * | 5/2001 | Northam | 42/16 |
| 8,115,562 B2 | * | 2/2012 | Igarashi | 331/116 R |
| 2005/0059375 A1 | | 3/2005 | Abe et al. | |

FOREIGN PATENT DOCUMENTS

| | | |
|---|---|---|
| JP | U-60-124123 | 8/1985 |
| JP | A-63-169110 | 7/1988 |
| JP | A-63-248204 | 10/1988 |
| JP | A-4-40004 | 2/1992 |
| JP | A-4-129303 | 4/1992 |
| JP | A-2005-39640 | 2/2005 |
| JP | A-2005-45405 | 2/2005 |
| JP | A-2010-4322 | 1/2010 |

* cited by examiner

*Primary Examiner* — Joseph Chang
(74) *Attorney, Agent, or Firm* — Oliff PLC

(57) ABSTRACT

An oscillator circuit includes a resonator (SAW resonator), an amplifier circuit, and a switching element (NMOS switch). The amplifier circuit has a feedback path from one end to the other end of the resonator, a first inductance element (elongated coil) provided in the feedback path, and a variable capacitance element (variable capacitance diode) provided in the feedback path in series with the first inductance element. The switching element is provided in parallel to a circuit part including the first inductance element and the variable capacitance element.

20 Claims, 3 Drawing Sheets

OSCILLATOR CIRCUIT, OSCILLATOR, ELECTRONIC APPARATUS, AND ACTIVATION METHOD OSCILLATOR CIRCUIT

BACKGROUND

1. Technical Field

The present invention relates to an oscillator circuit, an oscillator, an electronic apparatus, and an activation method of the oscillator circuit.

2. Related Art

Voltage Controlled Oscillators (VCOs) that can change oscillation frequencies in response to control voltages have been widely known and used for various uses. Voltage Controlled X'tal Oscillators (VCXOs) using crystal oscillators having high frequency stability and Voltage Controlled SAW Oscillators (VCSOs) using Surface Acoustic Wave (SAW) resonators, etc. are used for various uses. The VCXO has high frequency stability and the VCSO has a high oscillation frequency, and thus, these oscillators are selectively used for intended uses. In these oscillators, a variable capacitance element is connected to one end of the resonator such as the crystal oscillator or the SAW resonator, and thereby, the oscillator may be oscillated at the frequency in response to the capacitance value of the variable capacitance element between the resonance frequency and the antiresonance frequency of the resonator. In the case where the difference between the resonance frequency and the antiresonance frequency is smaller, i.e., the frequency variable range as the VCO is narrower, an inductance element (elongated coil) is inserted in series in the resonator for the purpose of widening the frequency variable range as the VCO. However, by insertion of the elongated coil, an LC oscillation mode by the inductance L of the elongated coil and capacitance of the circuit (capacitance of the variable capacitance element or the like) C also exists in addition to the original oscillation mode, and the LC oscillation may be selected depending on various conditions at activation of oscillation and oscillation at the original frequency may not be performed.

In order to solve the problem, Patent Document 1 (JP-A-2010-4322) has proposed a method of preventing abnormal oscillation by setting load capacitance of the crystal oscillator to load capacitance that may hardly cause abnormal oscillation using the variable capacitance circuit only at activation of oscillation.

However, in the method of Patent Document 1, not only the setting of the variable capacitance circuit is necessary but also a larger capacitance value is necessary depending on the inductance value of the elongated coil, and the mounting area and the cost may be significantly increased.

SUMMARY

An advantage of some aspects of the invention is to provide an oscillator circuit, an oscillator, an electronic apparatus, and an activation method of the oscillator circuit that can efficiently suppress abnormal oscillation at activation generated due to an inductance element.

(1) An oscillator circuit according to one aspect of the invention includes a resonator, an amplifier circuit having a feedback path from one end to the other end of the resonator, a first inductance element provided in the feedback path, and a variable capacitance element provided in the feedback path in series with the first inductance element, and a switching element provided in parallel to a circuit part including the first inductance element and the variable capacitance element.

According to the aspect of the invention, the switching element is turned on and the first inductance element is excluded from the feedback path from the rise of the power supply voltage until the original oscillation by the resonator develops and becomes stable, and thereby, abnormal oscillation at activation generated due to the first inductance element may be efficiently suppressed. Further, after the original oscillation by the resonator has become stable, the switching element is turned off and the first inductance element is included into the feedback path, and thereby, the variable range of the oscillation frequency may be made wider.

Further, according to the aspect of the invention, when the switching element is turned off, the variable capacitance element is also included into the feedback path together with the first inductance element, and thus, the amount of change of the reactance of the feedback path at the moment the switching element is switched from on to off may be made smaller by the amount of the variable capacitance element. Therefore, variations of the oscillation frequency at the moment the switching element is switched from on to off may be suppressed smaller.

(2) The oscillator circuit may further include a delay circuit that delays a signal for controlling on and off of the switching element.

According to the configuration, after a predetermined time in response to the delay circuit has elapsed, on/off of the switching element may be automatically switched. For example, by inputting the power supply voltage to the delay circuit, the switching element may be switched from on to off after the predetermined time has elapsed from the rise of the power supply voltage.

(3) In the oscillator circuit, the amplifier circuit may further include a first resistor provided in parallel to or series with the first inductance element.

According to the configuration, the effective Q-value of the first inductance element becomes lower and abnormal oscillation due to the first inductance element after the switching element has been switched from on to off may be effectively suppressed.

(4) In the oscillator circuit, the amplifier circuit may include an amplifying element that amplifies an output signal of the resonator, and the amplifying element and the switching element may be integrated in one integrated circuit chip.

According to the configuration, the switch component as an alternative for the switching element becomes unnecessary and the number of components may be reduced.

(5) In the oscillator circuit, the amplifier circuit may include a second inductance element provided in series with the circuit part in the feedback path.

According to the configuration, from the rise of the power supply voltage until the original oscillation by the resonator has developed and become stable, the effective resistance value of the resonator becomes lower and the resonator becomes likely to oscillate, and, after the original oscillation by the resonator has developed and become stable, the switching element is turned off and the first inductance element and the second inductance element are included in the feedback path, and thereby, the variable range of the oscillation frequency may be efficiently made wider.

(6) In the oscillator circuit, the second inductance element may have an inductance value smaller than that of the first inductance element.

According to the configuration, from the rise of the power supply voltage until the original oscillation by the resonator has developed and become stable, abnormal oscillation at activation generated due to the second inductance element may be suppressed.

(7) In the oscillator circuit, the amplifier circuit may further include a second resistor provided in parallel to or series with the second inductance element.

According to the configuration, the effective Q-value of the second inductance element becomes lower and abnormal oscillation due to the second inductance element may be effectively suppressed.

(8) An oscillator according to one aspect of the invention includes any one of the above described oscillator circuits.

(9) An electronic apparatus according to one aspect of the invention includes any one of the above described oscillator circuits.

(10) An activation method of an oscillator circuit according to one aspect of the invention includes a resonator, and an amplifier circuit having a feedback path from one end to the other end of the resonator and provided with an inductance element and a variable capacitance element provided in series in the feedback path, and includes short-circuiting both ends of a circuit part including the inductance element and the variable capacitance element in a predetermined period after a power supply is turned on, and terminating the short-circuiting of the circuit part after the predetermined period has elapsed.

"Short-circuiting both ends of a circuit part including the inductance element and the variable capacitance element" does not necessarily strictly refers to the resistance value between the ends of the circuit part of 0Ω, but the lower resistance or the lower impedance to the degree at which the inductance element and the variable capacitance element do not substantially function. For example, a switching element (MOS transistor or the like) is provided between the ends of the circuit part, the switching element is turned on, and thereby, the ends of the circuit part is short-circuited. Further, the switching element is turned off, and thereby, short-circuiting between the ends of the circuit part may be terminated.

According to the aspects of the invention, the first inductance element is excluded from the feedback path from the rise of the power supply voltage until the original oscillation by the resonator develops and becomes stable, and thereby, abnormal oscillation at activation generated due to the first inductance element may be efficiently suppressed. Further, after the original oscillation by the resonator has become stable, the first inductance element is included into the feedback path, and thereby, the variable range of the oscillation frequency may be made wider.

Further, according to the aspects of the invention, the variable capacitance element is also included into the feedback path together with the first inductance element, and thus, the amount of change of the reactance of the feedback path before and after the inclusion may be made smaller by the amount of the variable capacitance element. Therefore, variations of the oscillation frequency may be suppressed smaller.

BRIEF DESCRIPTION OF THE DRAWINGS

The invention will be described with reference to the accompanying drawings, wherein like numbers reference like elements.

DESCRIPTION OF EXEMPLARY EMBODIMENTS

As below, preferred embodiments of the invention will be explained in detail using the drawings. Note that the following embodiments do not unduly limit the invention described in the appended claims. Further, all of the configurations explained as below may not necessarily be the essential component elements of the invention.

1. First Embodiment

Figure 1:
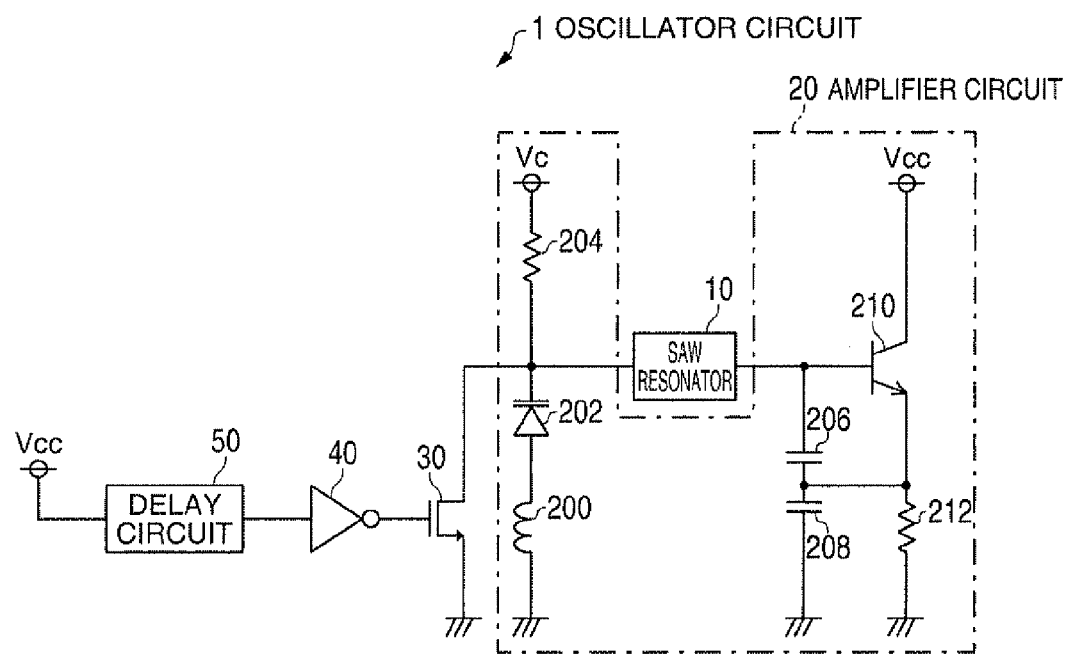
FIG. 1 shows a configuration example of an oscillator circuit of the first embodiment.

FIG. 1 shows a configuration example of an oscillator circuit of the first embodiment. An oscillator circuit 1 of the embodiment includes a SAW resonator 10, an amplifier circuit 20, an NMOS switch 30, an inverter circuit 40, and a delay circuit 50. Note that, in the oscillator circuit 1 of the embodiment, part of these elements may be omitted or other elements may be added. Particularly, the delay circuit 50 may be provided outside of the oscillator circuit 1.

The amplifier circuit 20 has an oscillation loop (feedback path) from the output terminal to the input terminal of the SAW resonator 10 (an example of the resonator), and amplifies the output signal of the SAW resonator 10 and feeds it back to the input of the SAW resonator 10 via the oscillation loop, and thereby, continues the oscillation of the SAW resonator 10.

In the embodiment, the amplifier circuit 20 includes an elongated coil 200, a variable capacitance diode 202, resistors 204, 212, capacitors 206, 208, and an NPN transistor 210. Note that, in the amplifier circuit 20, part of these elements may be omitted or other elements may be added.

In the NPN transistor 210 (an example of the amplifying element), a base terminal is connected to the output terminal of the SAW resonator 10, a power supply voltage Vcc is supplied to a collector terminal, and an emitter terminal is connected to the ground via the resistor 212.

The capacitor 206 and the capacitor 208 are series-connected between the base terminal of the NPN transistor 210 and the ground, and the connection point between the capacitor 206 and the capacitor 208 is connected to the emitter terminal of the NPN transistor 210.

According to the configuration, the output signal of the SAW resonator 10 is amplified by the NPN transistor 210, propagated in the oscillation loop via the emitter terminal of the NPN transistor 210, the resistor 212, and the ground, and input to the input terminal of the SAW resonator 10. Further, the SAW resonator 10 behaves as an inductance element, and thereby, the so-called Colpitts oscillator circuit is formed.

Furthermore, in the oscillator circuit 1 of the embodiment, in the oscillation loop, the elongated coil 200 (an example of the first inductance element) and the variable capacitance diode 202 (an example of the variable capacitance element) are provided. Specifically, the elongated coil 200 and the variable capacitance diode 202 are series-connected between the input terminal of the SAW resonator 10 and the ground.

A control voltage Vc is supplied to the cathode of the variable capacitance diode 202 via the resistor 204 and the capacitance value of the variable capacitance diode 202 changes in response to the value of the control voltage Vc, and thereby, the oscillation frequency changes. That is, the oscillator circuit 1 functions as a voltage controlled SAW oscillator circuit.

The elongated coil 200 serves to widen the variable range of the oscillation frequency. It is desirable that the inductance value of the elongated coil 200 is larger because the variable range of the frequency is wider, however, the larger the inductance value of the elongated coil 200, the lower the LC oscillation frequency by the elongated coil 200 and the circuit capacitance. Then, the LC oscillation is likely to occur at activation (power activation) because the negative resistance of the amplifier circuit 20 is inversely proportional to the square of the frequency and the lower the LC oscillation frequency, the larger the negative resistance. That is, there is a problem that abnormal oscillation is more likely to occur at activation as the variable range of the original oscillation frequency by the SAW resonator 10 and the circuit capacitance is made wider.

In order to solve the problem, in the embodiment, a drain terminal and a source terminal of the NMOS switch 30 (an example of the switching element) are respectively connected in parallel to the series connection circuit of the variable capacitance diode 202 and the elongated coil 200 (an example of the circuit part including the first inductance element and the variable capacitance element), i.e., between the cathode of the variable capacitance diode 202 and the ground. Further, at activation of the oscillator circuit 1, the NMOS switch 30 is turned on in a predetermined time, and thereby, the variable capacitance diode 202 and the elongated coil 200 may be excluded from the oscillation loop until the oscillation by the SAW resonator 10 and the circuit capacitance develops and becomes stable. After the predetermined time has elapsed, the NMOS switch 30 is turned off and the variable capacitance diode 202 and the elongated coil 200 may be included into the oscillation loop. Thereby, abnormal oscillation becomes hard to occur at activation and the variable range of the oscillation frequency may be made wider.

In the embodiment, in order to turn on the NMOS switch 30 in the predetermined period at activation and turn off the NMOS switch 30 after the predetermined time has elapsed, the delay circuit 50 and the inverter circuit 40 are series-connected between the power supply terminal and the gate terminal of the NMOS switch 30. The delay circuit 50 outputs the low level after power activation before the predetermined time has elapsed and continues to output the high level after the predetermined time has elapsed. Then, the logic level is inverted in the inverter circuit 40, and thus, the NMOS switch 30 is on in the predetermined time from power activation and constantly off after the predetermined time has elapsed.

Figure 2:
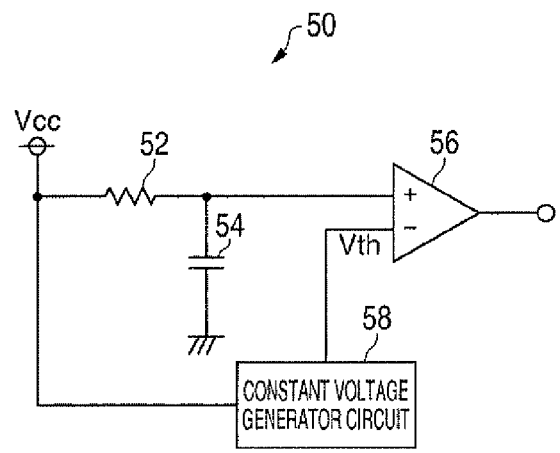
FIG. 2 shows a configuration example of a delay circuit.

FIG. 2 shows a configuration example of the delay circuit 50. In the delay circuit 50 shown in FIG. 2, an RC integrator circuit by a resistor 52 and a capacitor 54 is connected between the power supply terminal and a non-inverting input terminal (positive input terminal) of a comparator 56, and a constant voltage Vth generated by a constant voltage generator circuit 58 is supplied to a inverting input terminal (negative input terminal) of the comparator 56. According to the configuration, from the moment the power is turned on before a predetermined time determined in response to the time constant of the RC integrator circuit elapses, the voltage of the non-inverting input terminal (positive input terminal) of the comparator 56 is lower than the Vth and the output level of the comparator 56 (the output level of the delay circuit 50) is the low level. On the other hand, after the predetermined time has elapsed from the power activation, the voltage of the non-inverting input terminal (positive input terminal) of the comparator 56 is higher than the Vth and the output level of the comparator 56 (the output level of the delay circuit 50) is the high level.

Figure 3:
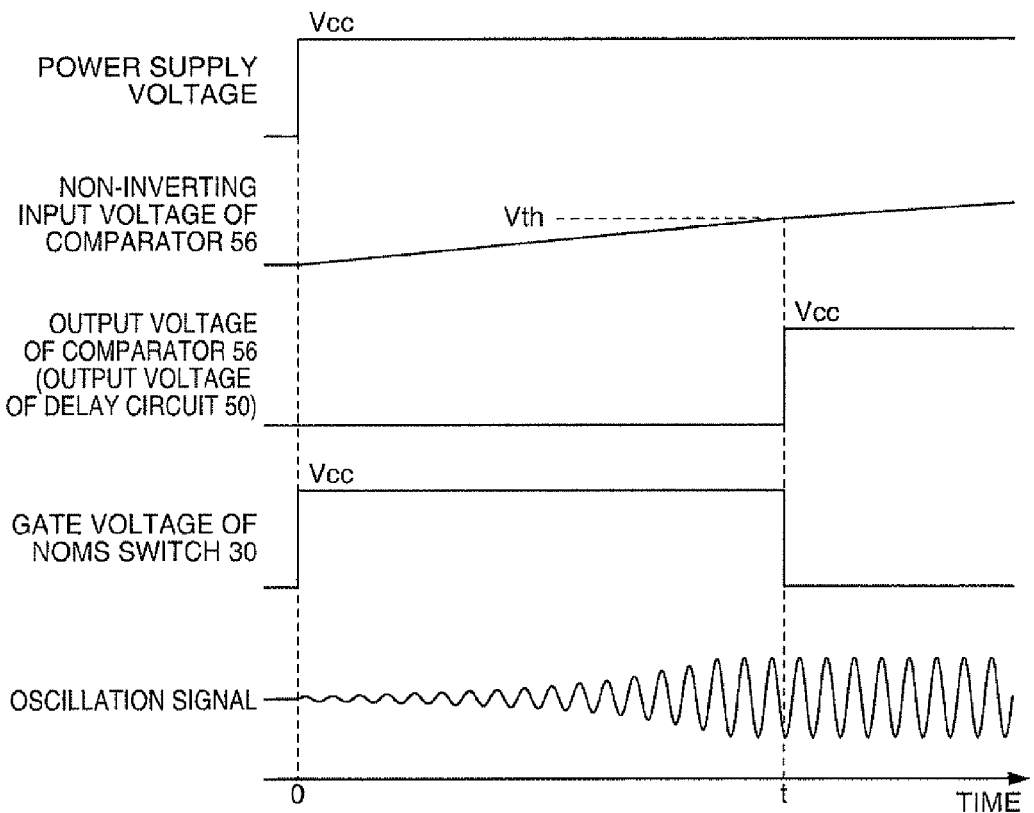
FIG. 3 shows an example of waveforms at activation of the oscillator circuit.

FIG. 3 shows an example of waveforms at activation of the oscillator circuit 1 of the embodiment. As shown in FIG. 3, when the power supply voltage Vcc is supplied to the power supply terminal at time "0", the voltage of the non-inverting input terminal (positive input terminal) of the comparator 56 contained in the delay circuit 50 gradually rises in response to the time constant of the RC integrator circuit by the resistor 52 and the capacitor 54. Then, after a predetermined time t has elapsed, the voltage of the non-inverting input terminal (positive input terminal) of the comparator 56 becomes equal to the Vth. Therefore, the output level of the delay circuit 50 is the low level after power activation before the predetermined time t has elapsed and the high level after the predetermined time t has elapsed.

As a result, the gate voltage of the NMOS switch 30 is at the high level after power activation before the predetermined time t has elapsed and at the low level after the predetermined time t has elapsed. Therefore, the NMOS switch 30 is on after power activation before the predetermined time t has elapsed and turned off after the predetermined time t has elapsed. Thereby, the variable capacitance diode 202 and the elongated coil 200 may be excluded from the oscillation loop after power activation before the predetermined time t has elapsed and the variable capacitance diode 202 and the elongated coil 200 may be included into the oscillation loop after the predetermined time t has elapsed.

Note that the constant voltage Vth is set so that the predetermined time t may be a sufficient time (for example, 50 µs to 200 µs) for stability of the oscillation of the oscillator circuit 1 (the oscillation signal output from the emitter terminal of the NPN transistor 210).

As described above, according to the oscillator circuit 1 of the first embodiment, after power activation before the oscillation by the SAW resonator 10 and the circuit capacitance develops and becomes stable, the variable capacitance diode 202 and the elongated coil 200 are excluded from the oscillation loop, and thereby, abnormal oscillation becomes hard to occur at activation. After the predetermined time has elapsed, the variable capacitance diode 202 and the elongated coil 200 are included into the oscillation loop, and thereby, the variable range of the oscillation frequency may be made wider.

Note that, if only the elongated coil 200 is included into the oscillation loop after the predetermined time has elapsed from power supply activation, the amount of change of the reactance of the oscillation loop is $\omega L$ ($\omega$ is an angular frequency, and L is an inductance value of the elongated coil 200). Therefore, when the inductance value of the elongated coil 200 is larger, the oscillation frequency largely changes at the moment the NMOS switch 30 is switched from on to off. On the other hand, in the embodiment, the variable capacitance diode 202 is also included into the oscillation loop with the elongated coil 200 after the predetermined time has elapsed from power activation, and thus, the amount of change of the reactance of the oscillation loop is $\omega L - 1/(\omega C_v)$ ($\omega$ is an angular frequency, L is an inductance value of the elongated coil 200, and $C_v$ is a capacitance value of the variable capacitance diode 202) and the amount of change of the reactance may be made smaller. Therefore, the amount of change of the oscillation frequency when the NMOS switch 30 is switched from on to off may be suppressed smaller.

Note that the oscillator circuit 1 may be realized by integrating the amplifier circuit 20, the NMOS switch 30, and the inverter circuit 40 in One IC (Integrated Circuit) chip (integrated circuit chip). In this manner, the switch component as an alternative for the NMOS switch 30 becomes unnecessary and the number of components may be reduced. Further, also the delay circuit 50 is integrated in the IC chip, and thereby, it becomes unnecessary to mount the delay circuit 50 on the board and the cost may be reduced.

2. Second Embodiment

Figure 4:
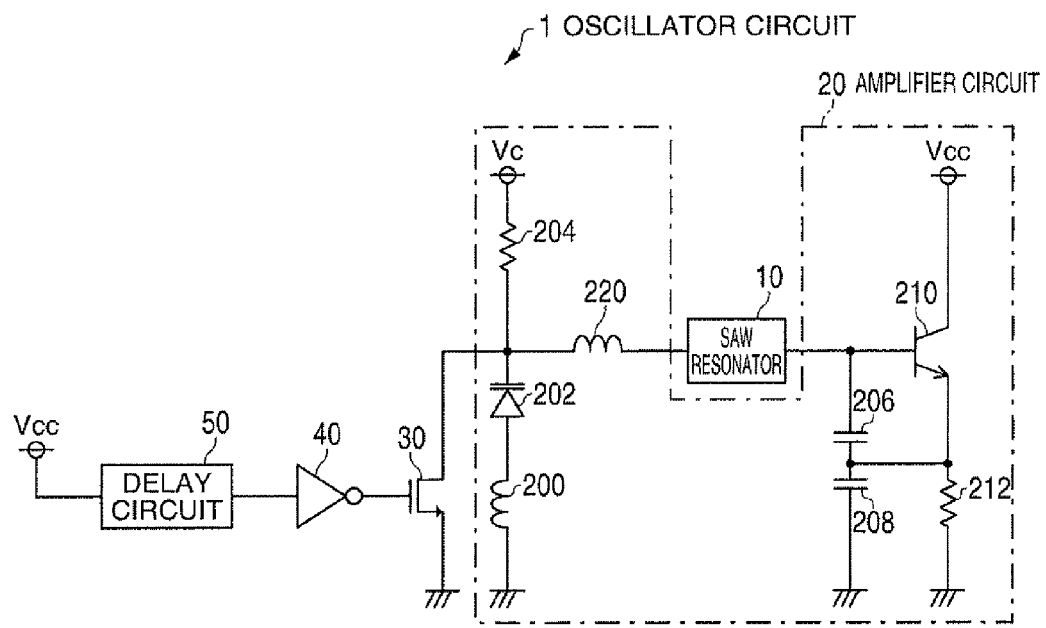
FIG. 4 shows a configuration example of an oscillator circuit of the second embodiment.

FIG. 4 shows a configuration example of an oscillator circuit of the second embodiment. The oscillator circuit 1 of the second embodiment is different from the oscillator circuit 1 of the first embodiment shown in FIG. 1 only in that an elongated coil 220 is provided between the variable capacitance diode 202 and the SAW resonator 10. In FIG. 4, the same configurations as those in FIG. 1 have the same signs and their explanation will be omitted.

The elongated coil 220 (an example of the second inductance element) is provided in the oscillation loop, and serves to widen the variable range of the oscillation frequency with the elongated coil 200.

In the embodiment, when the oscillator circuit 1 is activated, the NMOS switch 30 is turned on only in a predetermined time, and thereby, the variable capacitance diode 202 and the elongated coil 200 are excluded from the oscillation loop until the oscillation by the SAW resonator 10 and the circuit capacitance develops and becomes stable, however, the elongated coil 220 remains in the oscillation loop.

Figure 5:
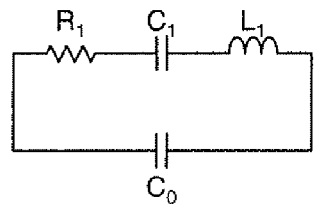
FIG. 5 shows an equivalent circuit of a SAW resonator.

The SAW resonator 10 is expressed by an equivalent circuit as shown in FIG. 5 ($R_1$ is an equivalent series resonance resistor, $L_1$ is an equivalent series inductance, and $C_0$ is equivalent parallel resonance capacitance), and calculated by the effective resistance $Re=R_1 \times (1+C_0/C_L)^2$ ($C_L$ is load capacitance) of the SAW resonator 10. When the elongated coil 220 is included in the oscillation loop, the load seen from the SAW resonator 10 becomes inductive and the load capacitance $C_L$ takes a negative value. Accordingly, the effective resistance Re of the SAW resonator 10 becomes lower and the SAW resonator 10 becomes likely to oscillate.

Further, when the inductance value of the elongated coil 220 is made smaller to a certain degree, the LC oscillation (abnormal oscillation) by the elongated coil 220 and the circuit capacitance is hard to occur at activation of the oscillator circuit 1, and the oscillation by the SAW resonator 10 and the circuit capacitance develops and becomes stable.

Then, after a predetermined time has elapsed, the NMOS switch 30 is turned off and the variable capacitance diode 202 and the elongated coil 200 may be included into the oscillation loop together with the elongated coil 220. After the oscillation by the SAW resonator 10 and the circuit capacitance has become stable by increasing the inductance value of the elongated coil 200, the variable range of the oscillation frequency may be made sufficiently wider. The variable range of the oscillation frequency is determined by the sum of the inductance value of the elongated coil 200 and the inductance value of the elongated coil 220.

As described above, according to the oscillator circuit 1 of the second embodiment, after power activation before the oscillation by the SAW resonator 10 and the circuit capacitance develops and becomes stable, the variable capacitance diode 202 and the elongated coil 200 are excluded from the oscillation loop, thereby, abnormal oscillation becomes hard to occur at activation, and the elongated coil 220 is included in the oscillation loop, and thereby, the SAW resonator 10 becomes likely to oscillate. After the predetermined time has elapsed, the variable capacitance diode 202 and the elongated coil 200 are included into the oscillation loop together with the elongated coil 220, and thereby, the variable range of the oscillation frequency may be made wider.

Note that it is desirable that the inductance value of the elongated coil 220 (the second inductance value) is made smaller than the inductance value of the elongated coil 200 (the first inductance value). According to the configuration, the LC oscillation (abnormal oscillation) by the elongated coil 220 and the circuit capacitance becomes hard to occur at activation of the oscillator circuit 1, and the variable range of the oscillation frequency may be made wider after the oscillation by the SAW resonator 10 and the circuit capacitance has developed and become stable.

3. Third Embodiment

Figure 6:
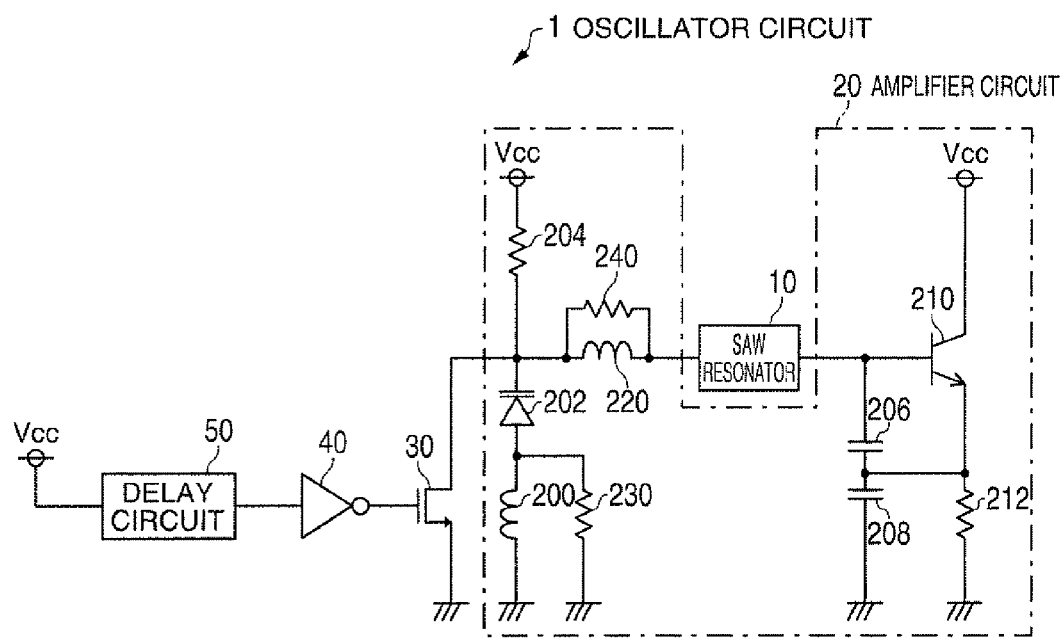
FIG. 6 shows a configuration example of an oscillator circuit of the third embodiment.

FIG. 6 shows a configuration example of an oscillator circuit of the third embodiment. The oscillator circuit 1 of the third embodiment is different from the oscillator circuit 1 of the second embodiment shown in FIG. 4 only in that a resistor 230 is connected in parallel to the elongated coil 200 and a resistor 240 is connected in parallel to the elongated coil 220. In FIG. 6, the same configurations as those in FIG. 4 have the same signs and their explanation will be omitted.

The resistor 230 (an example of the first resistor) is called a damping resistor or Q-damp resistor, and serves to reduce the effective Q-value of the elongated coil 200. Similarly, the resistor 240 (an example of the second resistor) is called a damping resistor or Q-damp resistor, and serves to reduce the effective Q-value of the elongated coil 220.

The variable range of the oscillation frequency may be made wider by increasing the inductance value of the elongated coil 200, however, if the inductance value becomes larger, the LC oscillation frequency by the elongated coil 200 and the circuit capacitance becomes lower and the LC oscillation may occur at the moment the NMOS switch 30 is turned off. Accordingly, in the embodiment, by connecting the resistor 230 in parallel to the elongated coil 200, the effective Q-value of the elongated coil 200 becomes lower, and thereby, the LC oscillation by the elongated coil 200 and the circuit capacitance is hard to occur.

Further, the inductance value of the elongated coil 220 may be made smaller and the LC oscillation by the elongated coil 220 and the circuit capacitance is hard to occur at activation of the oscillator circuit 1, however, in the embodiment, by connecting the resistor 240 in parallel to the elongated coil 220, the effective Q-value of the elongated coil 220 becomes lower, and the LC oscillation is harder to occur.

Note that the invention is not limited to the embodiments, various modification may be made within the scope of the invention.

As the resonator, for example, the SAW resonator, an AT-cut crystal oscillator, an SC-cut crystal oscillator, a tuning fork crystal oscillator, or the like may be used.

As the substrate material of the resonator, a piezoelectric material such as piezoelectric single crystal of crystal, lithium tantalum, lithium niobate, or the like or piezoelectric ceramics of lead titanium zirconate or the like, or a silicon semiconductor material, or the like may be used.

As an exciting unit for the resonator, those utilizing the piezoelectric effect or electrostatic drive utilizing Coulomb force may be used.

Further, as the switching element, a bipolar transistor, a field effect transistor (FET), a metal oxide semiconductor field effect transistor (MOSFET), a thyristor, or the like may be used.

Furthermore, in the embodiment, the voltage controlled SAW oscillator circuit has been explained as an example, however, the invention may be applied to an arbitrary oscillator circuit provided with an inductance element and a variable capacitance element in the oscillation loop.

In addition, the invention may be applied to oscillators including oscillator circuits. The oscillator of the invention is not particularly limited, but a piezoelectric oscillator (a crystal oscillator or the like), a SAW oscillator, a voltage controlled oscillator (VCXO, VCSO, or the like), a temperature compensated oscillator (TOXO or the like), an oven controlled oscillator (OCXO or the like), a silicon oscillator, an atomic oscillator, or the like may be cited.

Further, the invention may be applied to an electronic apparatus including the oscillator circuit. As the electronic apparatus of the invention, not particularly limited, but a personal computer (for example, a mobile personal computer), a mobile terminal such as a cellular phone, a digital still camera, an inkjet ejection device (for example, an inkjet printer), a laptop personal computer, a tablet personal computer, a storage area network device such as a rooter or switch, a local area network device, a television, a video camera, a video tape recorder, a navigation system, a pager, a personal digital assistance (with or without communication function), an electronic dictionary, a calculator, an electronic game machine, a game controller, a word processor, a work station, a videophone, a security television monitor, electronic binoculars, a POS terminal, a medical device (for example, an electronic thermometer, a sphygmomanometer, a blood glucose meter, an electrocardiographic measurement system, an ultrasonic diagnostic system, or an electronic endoscope), a fish finder, various measurement instruments, meters and gauges (for example, meters for vehicles, airplanes, and ships), a flight simulator, a head-mounted display, motion trace, motion tracking, a motion controller, a PDR (Pedestrian Dead Reckoning), etc. may be cited.

The invention includes substantially the same configurations (the same configurations in function, method, and result or the same configurations in purpose and effect) as the configurations explained in the embodiments. Further, the invention includes configurations in which non-essential parts of the configurations explained in the embodiments are replaced. Furthermore, the invention includes configurations that may exert the same effects and configurations that may achieve the same purposes as those explained in the embodiments. In addition, the invention includes configurations formed by adding known technologies to the configurations explained in the embodiments.

The entire disclosure of Japanese Patent Application No: 2011-212838, filed Sep. 28, 2011 is expressly incorporated by reference herein.

What is claimed is:

1. An oscillator circuit comprising:
a resonator;
an amplifier circuit having a feedback path from one end to the other end of the resonator, a first inductance element provided in the feedback path, and a variable capacitance element provided in the feedback path in series with the first inductance element; and
a switching element provided in parallel to a circuit part including the first inductance element and the variable capacitance element.

2. The oscillator circuit according to claim 1, further comprising a delay circuit that delays a signal for controlling on and off of the switching element.

3. The oscillator circuit according to claim 1, wherein the amplifier circuit further includes a first resistor provided in parallel to or series with the first inductance element.

4. The oscillator circuit according to claim 1, wherein the amplifier circuit includes an amplifying element that amplifies an output signal of the resonator, and
the amplifying element and the switching element are integrated in one integrated circuit chip.

5. The oscillator circuit according to claim 1, wherein the amplifier circuit includes a second inductance element provided in series with the circuit part in the feedback path.

6. The oscillator circuit according to claim 5, wherein the second inductance element has an inductance value smaller than that of the first inductance element.

7. The oscillator circuit according to claim 5, wherein the amplifier circuit further includes a second resistor provided in parallel to or series with the second inductance element.

8. An oscillator comprising the oscillator circuit according to claim 1.

9. An oscillator comprising the oscillator circuit according to claim 2.

10. An oscillator comprising the oscillator circuit according to claim 3.

11. An oscillator comprising the oscillator circuit according to claim 4.

12. An oscillator comprising the oscillator circuit according to claim 5.

13. An oscillator comprising the oscillator circuit according to claim 6.

14. An electronic apparatus comprising the oscillator circuit according to claim 1.

15. An electronic apparatus comprising the oscillator circuit according to claim 2.

16. An electronic apparatus comprising the oscillator circuit according to claim 3.

17. An electronic apparatus comprising the oscillator circuit according to claim 4.

18. An electronic apparatus comprising the oscillator circuit according to claim 5.

19. An electronic apparatus comprising the oscillator circuit according to claim 6.

20. An activation method of an oscillator circuit including a resonator, and an amplifier circuit having a feedback path from one end to the other end of the resonator and provided with an inductance element and a variable capacitance element in series in the feedback path, the method comprising;
short-circuiting both ends of a circuit part including the inductance element and the variable capacitance element in a predetermined period after a power supply is turned on; and
terminating the short-circuiting of the circuit part after the predetermined period has elapsed.

* * * * *